United States Patent [19]

Flanigan et al.

[11] 4,403,271
[45] Sep. 6, 1983

[54] APPARATUS FOR MOUNTING AND PACKAGING DATA PROCESSING DEVICES

[75] Inventors: Charles D. Flanigan, San Jose; Edward R. Wiener, Monte Sereno, both of Calif.

[73] Assignee: International Business Machines Corporation, Armonk, N.Y.

[21] Appl. No.: 172,583

[22] Filed: Jul. 28, 1980

[51] Int. Cl.³ .............................................. H05K 7/20
[52] U.S. Cl. .................. 361/383; 248/27.1; 361/346; 361/393; 361/420
[58] Field of Search .................. 174/66, 67; 200/296; 248/27.1, 27.3; 312/283, 284; 73/431; 361/331, 346–348, 365, 369, 379, 380, 383, 384, 390, 392, 393, 394, 417, 420, 427, 428, 429

[56] References Cited

U.S. PATENT DOCUMENTS

| | | | |
|---|---|---|---|
| 1,492,309 | 4/1924 | Ogden | 361/429 |
| 3,139,559 | 6/1964 | Heidler | 361/393 |
| 3,296,404 | 1/1967 | Stevens | 174/66 |
| 3,437,738 | 4/1969 | Wagner | 174/66 |
| 3,462,553 | 8/1969 | Spranger | 361/383 |
| 3,544,703 | 12/1970 | Jones | 174/66 |
| 3,612,749 | 10/1971 | Grube, Jr. | 361/331 |
| 4,093,021 | 6/1978 | Groom | 248/27.1 |
| 4,177,499 | 12/1979 | Volkmann | 361/383 |

Primary Examiner—G. P. Tolin
Attorney, Agent, or Firm—Henry E. Otto, Jr.

[57] ABSTRACT

The apparatus and method herein disclosed is to permit modular mounting and packaging of a plurality of data processing devices of different configurations and functions in a standardized wall-like reticulated structure. This structure (10) has front and rear panels (12, 14) containing a plurality of identically configured apertures (11, 13). Covers (22, 23) configured to suit the different functions of the respective devices (17, 18) enclose protruding portions of such devices; but all such covers have identical peripheral dimensions conforming to but somewhat larger than that of the identically configured apertures so that any of the different devices may be mounted in any one of the apertures in the structure. The structures may be arranged in in line or staggered relation or at right angles to form a variety of configurations, but each structure is preferably connected to a respective support panel to provide a T-shaped free standing entity of high stability.

5 Claims, 3 Drawing Figures

U.S. Patent  Sep. 6, 1983  Sheet 1 of 2  4,403,271
FIG. 1
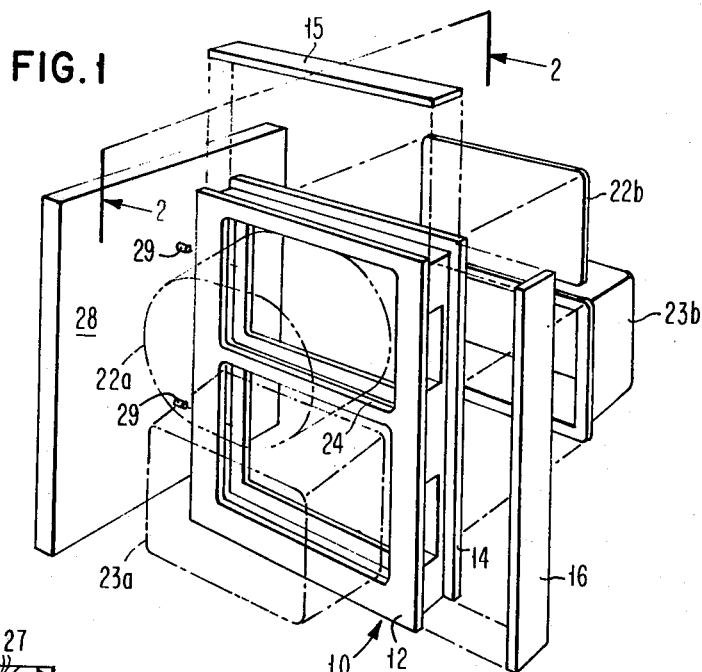
FIG. 4
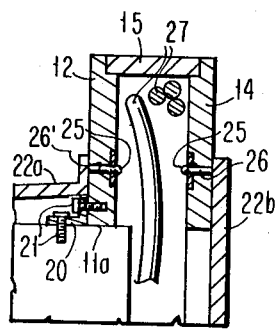
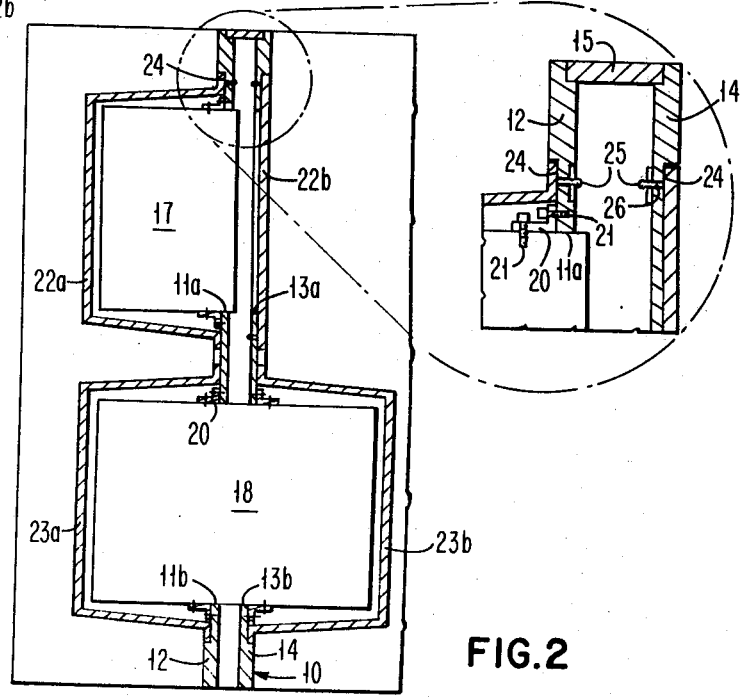
FIG. 2

APPARATUS FOR MOUNTING AND PACKAGING DATA PROCESSING DEVICES

TECHNICAL FIELD

This invention relates to an apparatus for and method of mounting data processing devices of differing configurations in standardized hollow structures in such manner that they are readily serviceable and are installable and removable as distinctive entities.

BACKGROUND ART

For many years, the various devices associated with a data processing system (such as central processing units, tape drives and disk drives) have been packaged in individual box-type enclosures and installed at spaced or contiguous locations within a data processing center. Each enclosure has to be specially designed and fabricated to meet specific requirements, which may result in limited packaging flexibility to accommodate growth, limited accessibility for service, poor utilization of floor space, and increased development cost.

U.S. Pat. No. 1,492,309 discloses a skeletal frame having a plurality of identically sized apertures for receiving and supporting a plurality of substantially identical electrical component-supporting trays and front panels affixed thereto. U.S. Pat. No. 3,139,559 discloses a compartmented housing for receiving a plurality of substantially identical network assemblies in a modular structure. This and other prior art known to applicants does not, however, disclose or suggest an apparatus and method for mounting data processing devices of relatively massive size and of differing configurations in standardized hollow structures having identical sets of apertures and enclosing the portions of said devices that project forwardly and rearwardly of the structure with covers that are distinctive to the particular device but have an outer dimension that enables them to be interchangeably mountable against any one of the apertures.

DISCLOSURE OF INVENTION

In accordance with the present invention, there is provided a distinctive apparatus and method for mounting and packaging different types of devices forming part of a data processing system. More specifically, the respective devices are selectively attached relative to modular apertures integrated within a common support structure.

One advantage of this arrangement is that cooling ducts and cabling may be housed within the structure in the hollow space adjacent to the installed device. Power supplies, electronics, and cooling equipment can be housed in the same manner as the devices. Another advantage is that the cover(s) or face plate(s) for each device can be molded or otherwise shaped to suit its utilitarian function, but all such covers or face plates for the various devices will be of the same standard peripheral dimension, thereby to enable one standardized structure to be used in mounting a plurality of different types of devices. Still another advantage of this arrangement is that it facilitates servicing as well as installation, removal and replacement of such devices by the customer and/or field engineer.

BRIEF DESCRIPTION OF DRAWINGS

The details of our invention will be described in connection with the accompanying drawings, in which:

FIG. 1 is an exploded perspective view of an apparatus constructed in accordance with one embodiment of the invention;

FIG. 2 is a vertical sectional view taken along the line 2—2 in FIG. 1;

FIG. 4 is a fragmentary sectional view showing a modified embodiment of the invention.

BEST MODE FOR CARRYING OUT THE INVENTION

Figure 3:
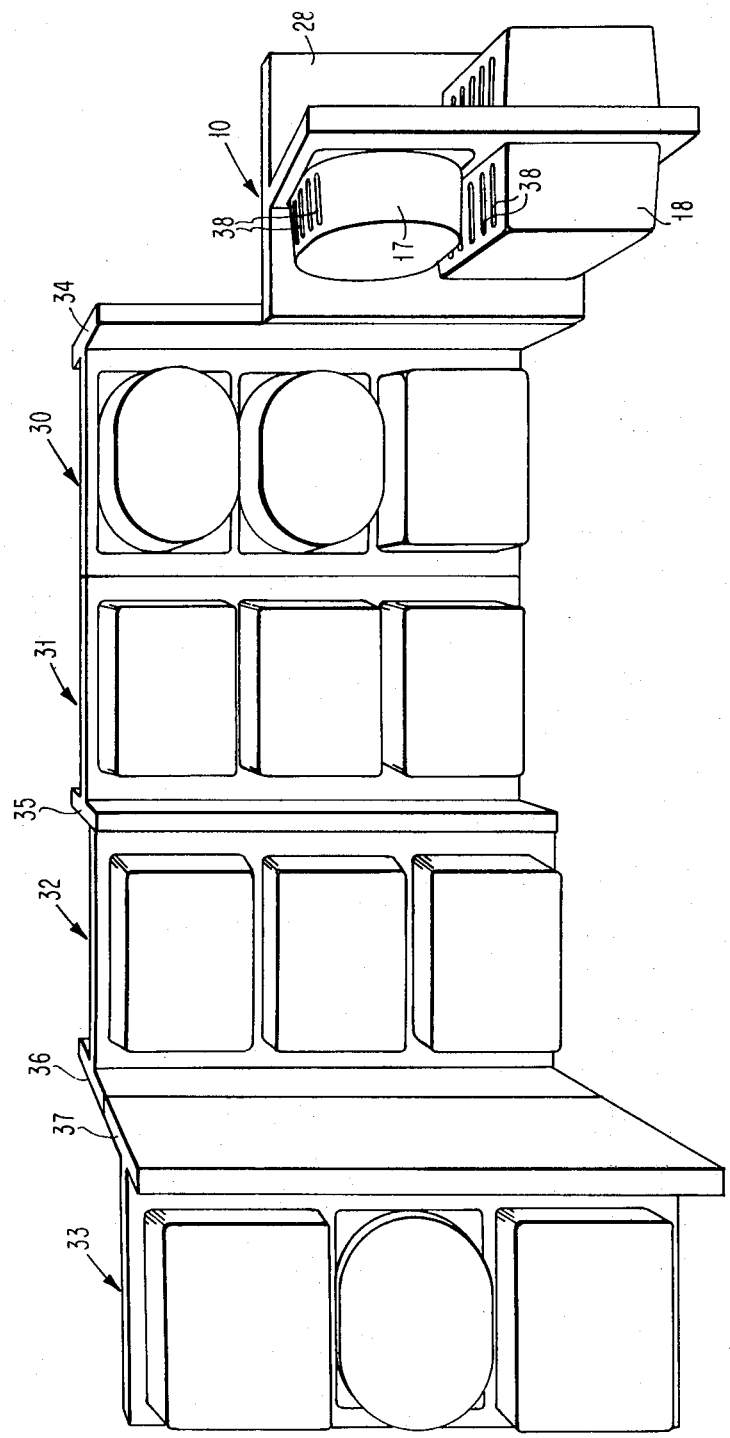
FIG. 3 is a perspective view of a data processing center composed of apparatus constructed in accordance with the first embodiment of the invention.

As illustrated in FIGS. 1-3, the apparatus embodying the invention comprises a housing in the form of a hollow wall-like reticulated structure 10 having two identical apertures 11a, b in a front panel 12. Structure 10 also has two apertures 13a, b in a rear panel 14. The apertures 13a, b are identical with each other and aligned with and preferably, but not necessarily, identical with the apertures 11a, b. Covers 15, 16 enclose the top and one side of structure 10.

Data processing devices, such as direct access storage device 17 and a central processing unit 18, having different physical characteristics are mounted adjacent to or penetrate through respectively relates sets (e.g., 11a, 13a and 11b and 13b) of the apertures. These devices project forwardly and/or rearwardly of the front panel 12 and rear panel 14, respectively, and are attached to structure 10 by suitable securing means preferably in the form of L-shaped brackets 20 and screws or bolts 21.

As illustrated, the front and rear portions of device 17 are enclosed and protected by front cover 22a and rear cover 22b, respectively; and the exposed front and rear portions of device 18 are enclosed and protected by covers 23a, b respectively. Note that these respective sets of covers 22, 23 are configured to suit the uniquely different configurations of the exposed portions of the corresponding devices 17, 18; but in accordance with an important feature of the invention, these covers have identical peripheral dimensions. These dimensions are somewhat larger than that of the associated apertures in the structure 10 so as to be mountable to the structure in overlying relation to such apertures. As illustrated, the covers 22, 23 are inset into respective recesses 24 provided in the panels 12, 14 in surrounding relation to the respective apertures 11, 13. This is so that the exposed surface of the flanged peripheral portions of the covers will be flush with the exposed surfaces of the panels 12 and 14. These covers 22, 23 enclose the brackets 20 and screws 21. They are preferably molded of plastic and provided with six molded spikes 25 that snap fit into respective mounting holes 26 in the panels 12 and 14 to removably attach the covers to the structure 10. Each set of six mounting holes 26 is identically located with respect to each aperture to enable interchangeability of all covers, such as 22, 23.

The front and rear panels 12, 14 are spaced far enough apart to serve as cooling ducts or channels through which cooling air may be circulated, if desired, in the spaces surrounding the mounted devices. The space between the panels 12 and 14 also is desirably used to house cabling 27 (FIG. 4) which can readily be accessed for servicing by removal of the covers 15, 16.

As illustrated in FIG. 1, structure 10 is suitably secured, such as by bolts 29, to a support panel 28 to provide a T-shaped free-standing entity of high stability.

In an exemplary data processing center, a plurality of structures and support panels may be interconnected in many different combinations, one of which is illustrated in FIG. 3. Note that, in accordance with the invention, devices 17, 18 and others not shown, may be mounted in any one of the aperture sets, such as 11, 13, even though their physical dimensions differ. If the cross-sectional area of the devices are equal, the various devices can be attached to the structure by identical L-shaped brackets 20; whereas if the cross-sectional area of a device is somewhat smaller than that of the apertures, connection may be made by L-shaped brackets of appropriately different size. The covers are configured to suit the uniquely different configurations of the associated devices; however, all covers have substantially identical peripheral dimensions corresponding to those of the recesses 24 surrounding the respective apertures, so as to overlap the aperture by preselected amounts for flush mounting of the covers in the manner above-described.

Accordingly, any structure (such as 10) with two sets of apertures, or structures (such as 30–33) with three sets of apertures may receive, support and suitably enclose any one of a plurality of different types of data processing devices (only two of which, 17, 18, are herein illustrated). Note that each such structure 30–33 is suitably secured to a respective support panel 34–37, which like panel 28 provides a T-shaped entity of high stability.

To facilitate cooling, cooling vents preferably in the form of a series of parallel slots 38, are provided in the upper portions of the covers, such as 22, 23. To reduce noise, the covers may be formed of or provided with sound-deadening material.

Reference is now made to FIG. 4, which illustrates a variation of the invention. According to this embodiment, no recesses 24 are provided in the front and rear panels 12, 14. Thus, instead of being inset into recesses, the covers (e.g., 22a) are mounted in overlying relation to the devices in surrounding relationship to the apertures. The spikes 25 are located the same as in the embodiment of FIGS. 1–3, but the holes 26' are located in a non-recessed surface of panels 12 and 14.

It will be understood that the term "data processing devices" as herein used is intended generically to cover central processing units, power supply units, tape drives, disk drives, and other major and relatively massive devices forming part of a data processing system. It should also be understood that the support panels 28 and 34–37 may be of different heights, and the structures may be arranged in in line or staggered relation or at right angles to form a variety of configurations; but each structure is preferably connected to its own respective support panel to provide a T-shaped free-standing entity of high stability.

While the invention has been shown and described with reference to preferred embodiment thereof, it will be understood by those skilled in the art that the foregoing and other changes in form and detail may be made therein without departing from the spirit, scope and teaching of the invention. Accordingly, the apparatus and method herein disclosed are to be considered merely as illustrative and the invention is to be limited only as specified in the claims.

We claim:

1. Data processing apparatus comprising:
   a housing means comprising a hollow wall-like structure having at least two pairs of apertures, those of each pair being coaxially aligned and of substantially identical configuration with those of every other pair,
   a plurality of data processing devices, at least two of which are of different size and configuration,
   means removably securing each such device to the structure in accommodating relation to at least one of the apertures of any selectable one of said pairs, such that at least one portion of each device projects outwardly of the structure,
   removable covers for each such device, those for each such different device being differently configured to suit the uniquely different configuration of the projecting portion of that specific device, but each such cover having a peripheral dimension that is larger than that of one of the identical apertures of each pair,
   said structure having therein in identical surrounding relation to each aperture a series of mounting holes,
   means including at least some of said mounting holes removably mounting each cover to enclose a corresponding projecting portion of such specific device but allow access to such device and to the corresponding securing means, and
   an upstanding support member disposed at right angles to said structure and secured to said structure to create a stable assemblage, whereby each device is selectably mountable in any of a plurality of locations in a standardized stable structure and readily removable so as to facilitate accessibility for servicing and/or field replacement of defective devices as distinct entities.

2. Apparatus according to claim 1, wherein each cover has preformed projecting elements that snap fit into the respective mounting holes to facilitate cover mounting.

3. Apparatus according to claim 1, wherein the mounting holes are provided in respective recessed areas of said housing means, each surrounding a respective aperture, and each cover is inset into one of the recessed areas such that its periphery is substantially flush with the non-recessed portion of the structure surrrounding the recessed areas.

4. Apparatus according to claim 1, wherein at least one of said covers has a plurality of identical openings to facilitate cooling of the respective enclosed device.

5. Apparatus according to claim 1, wherein the hollow structure is of such size as to provide sufficient space adjacent the respective devices to serve as cooling ducts and house any cabling that may be required.

* * * * *